United States Patent
Zhong et al.

(10) Patent No.: US 8,105,948 B2
(45) Date of Patent: Jan. 31, 2012

(54) USE OF CMP TO CONTACT A MTJ STRUCTURE WITHOUT FORMING A VIA

(75) Inventors: Adam Zhong, Milpitas, CA (US); Wai-Ming Kan, San Ramon, CA (US); Tom Zhong, Saratoga, CA (US); Chyu-Jiuh Torng, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 1000 days.

(21) Appl. No.: 12/070,286

(22) Filed: Feb. 14, 2008

(65) Prior Publication Data

US 2009/0209102 A1  Aug. 20, 2009

(51) Int. Cl.
*H01L 21/302* (2006.01)
(52) U.S. Cl. ........... 438/692; 438/691; 438/756; 216/88
(58) Field of Classification Search .................. 438/680, 438/691, 692, 693, 756; 216/89.9, 88, 89, 216/97
See application file for complete search history.

(56) References Cited

U.S. PATENT DOCUMENTS

| | | | |
|---|---|---|---|
| 6,956,270 B2 | 10/2005 | Fukuzumi | |
| 7,241,632 B2 * | 7/2007 | Yang | 438/3 |
| 7,245,522 B2 | 7/2007 | Aoki | |
| 2004/0033693 A1 * | 2/2004 | Park et al. | 438/691 |
| 2005/0084990 A1 * | 4/2005 | Liu et al. | 438/16 |
| 2005/0153561 A1 | 7/2005 | Jin et al. | |
| 2006/0148260 A1 * | 7/2006 | Zhang et al. | 438/692 |
| 2006/0157450 A1 * | 7/2006 | Chu et al. | 216/88 |
| 2006/0234445 A1 | 10/2006 | Yang | |
| 2006/0270152 A1 * | 11/2006 | Jeong et al. | 438/253 |

* cited by examiner

*Primary Examiner* — Lan Vinh
(74) *Attorney, Agent, or Firm* — Saile Ackerman LLC; Stephen B. Ackerman

(57) ABSTRACT

A process is described for making contact to the buried capping layers of GMR and MTJ devices without the need to form and fill via holes. CMP is applied to the structure in three steps: (1) conventional CMP (2) a Highly Selective Slurry (HSS) is substituted for the conventional slurry to just expose the capping layer, and (3) the HSS is diluted and used to clean the surface as well as to cause a slight protrusion of the capping layers above the surrounding dielectric surface, making it easier the contact them without damaging the devices below.

14 Claims, 2 Drawing Sheets

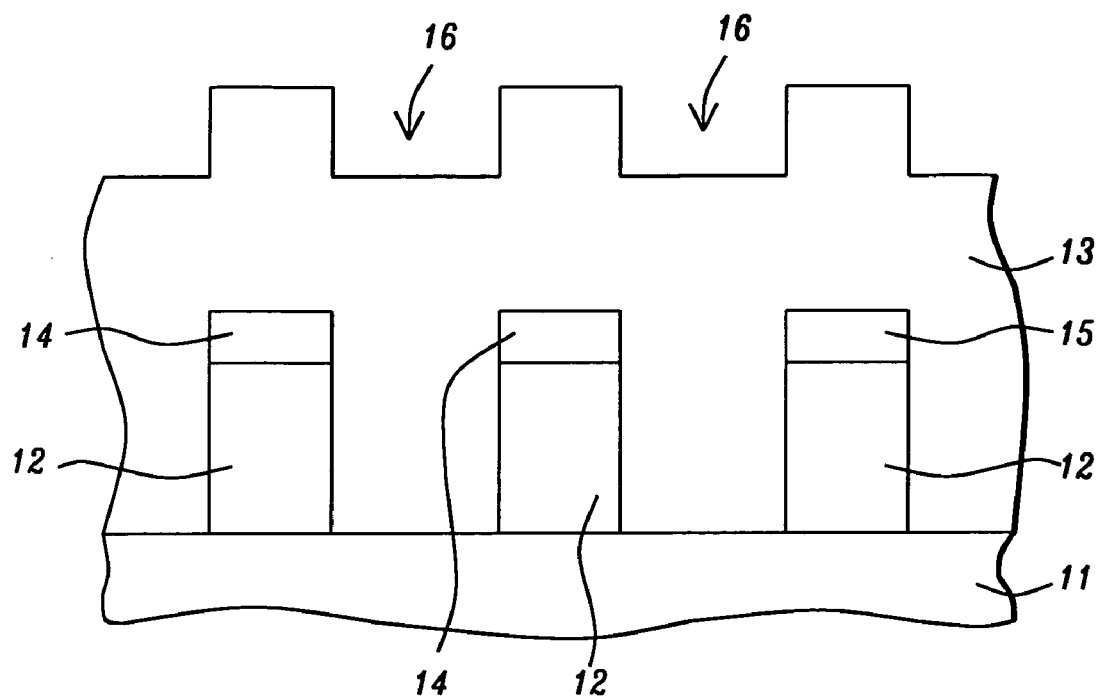
FIG. 1 — Prior Art
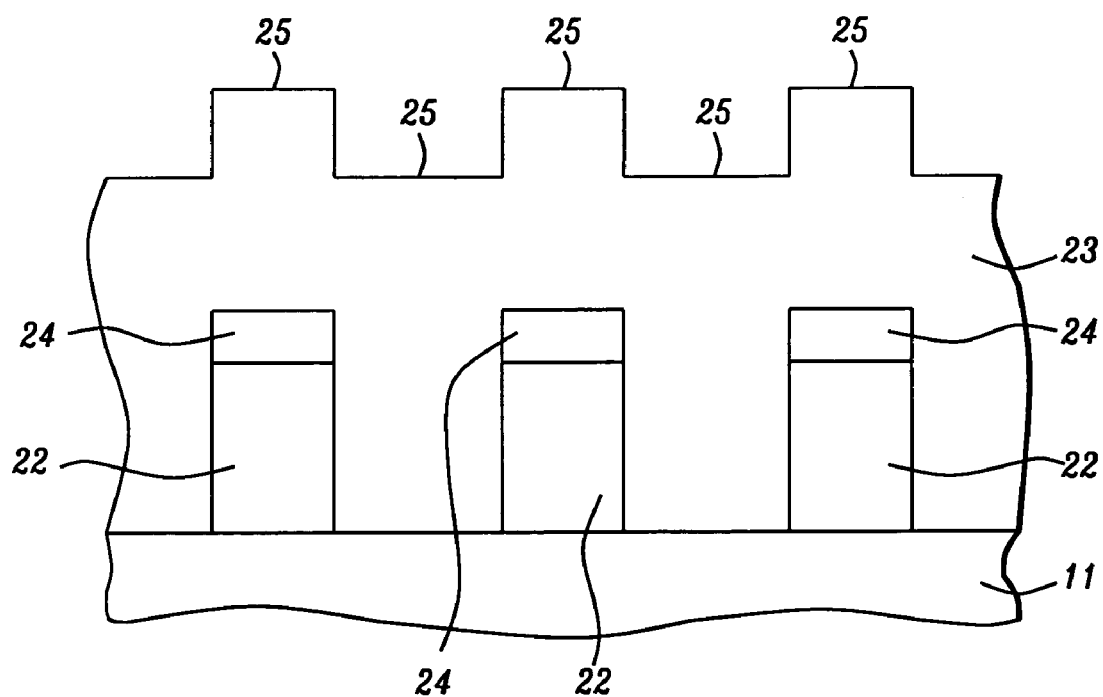
FIG. 2

USE OF CMP TO CONTACT A MTJ STRUCTURE WITHOUT FORMING A VIA

FIELD OF THE INVENTION

The invention relates to the general field of magnetic tunnel junction (MTJ) devices including magnetic random access memories (MRAM) and magnetic sensors, with particular reference to how to make contact to a buried capping layer.

BACKGROUND OF THE INVENTION

Magnetoresistive random access memory (MRAM) is one of the several types of random access memory in development that will likely serve as alternative to the main stream flash memory design. It will maintain a nonvolatile status while retaining the attributes of high density, high speed, and low power. The core technology difference between MRAM and other types of nonvolatile RAM is the way in which it defines and stores digital bits. Thin magnetic films are stacked in a structure called a magnetic tunnel junction (MTJ) and it is the variation in electrical resistance of current that pass through the two alternating state of magnetization of this MTJ structure that defines the digital bits ("0" and "1") for MRAM. The memory bit element can be programmed by a magnetic field created from pulse current carrying conductors above and below the junction structure. In a newer design of MRAM, a spin transfer switching technique can be used to manipulate the memory element as well. This new design will allow better packing and shrinkage of individual MTJ devices on the wafer, effectively increasing the overall density of the MRAM memory elements.

Recent developments in the field of magnetic sensors have led to the incorporation of MTJ devices to aid ultra-sensitive applications such as bio-sensors and current sensors. The ability to use an array of MTJ devices, to amplify the change in an internal or external magnetic field disturbance, will greatly increase the sensitivity of the magnetic sensor. In these applications, the ability to place the magnetic sensing device (generally a MTJ structure) as close as the source of the field disturbance as possible is critical to the success of the device.

After the deposition of the various required layers, the individual MTJ structures are formed by photolithography and reactive ion etching (RIE). A dielectric layer such as silicon oxide is then deposited to isolate the individual MTJ structures from one another. This is followed by planarization of the surface to facilitate subsequent photolithography using Chemical Mechanical Polishing (CMP). This is needed to flatten the surface and fully expose the top conductive cap layer of the MTJ for proper electrical contact to the next metal interconnect layer.

CMP is widely used in semiconductor fabrication to planarize a non-planar top surface during the processing of semiconductor wafers. The process uses a slurry of a corrosive chemical along with an abrasive, in conjunction with a polishing pad, to effect the planarization. The pad and wafer are pressed together by a dynamic polishing head and held in place by a plastic retaining ring. This removes excess top layer material and any irregular topography, making the wafer surface planar. One particular type of CMP involves the use of a highly selective slurry (HSS), which has the ability to remove different materials at significantly different removal rates. The HSS process has a tendency whereby the removal rate drops rapidly with decreasing pressure between the wafer and the CMP pad, caused by the diminishing topography on the surface of the wafer. CMP has been successfully adapted for use in shallow trench isolation (STI) as part of conventional semiconductor processing.

The magnetic tunnel junction structure serves as the critical core for storing a single bit of the MRAM. Prior to depositing the MTJ films, the area in which the MTJ device will be built should be made to be flat or slightly convex relative to the surrounding dummy (inter-device) areas. This is needed because, after most of the silicon oxide above the MTJ structure has been removed from most of the wafer, the removal rate of silicon oxide decreases dramatically due to the reduction in pressure between the wafer and the CMP pad surface. In order to ensure complete removal of the silicon dioxide on top of the MTJ all across the wafer, the device block needs to protrude slightly above the nearby dummy areas in order to generate an adequate silicon oxide removal rate. This can be accomplished by adjusting the oxidizing agent in the final slurry used in the metal CMP process of the previous layer. A decrease in oxidizing agent concentration will cause the rate of metal removal to be lower than that of the surrounding dielectric. This will allow the metal interconnect layer, or in the design of spin transfer MRAM, the metal via layer right below the MTJ structure, to be either flat or slightly protruded at the device block location.

A HSS is usually used as part of the shallow trench isolation (STI) process in the fabrication of conventional semiconductor devices. In that context, the STI process uses silicon nitride as a capping layer for the device structure, the latter acting as a top stop layer for the active silicon underneath. This is schematically illustrated in FIG. 1. Seen there are a series of semiconductor devices 12 on a common substrate 11 and embedded in dielectric layer 13. Each device 12 has a silicon nitride cap 14. As CMP proceeds, the reduced removal rate over the hard silicon nitride causes shallow trenches 16 to gradually be formed with a minimum amount of dishing. CMP is stopped when feedback from the polishing system indicates that the polish rate has reached a predetermined low value.

Previous processes for manufacturing MRAMs have typically used a via hole structure for forming the electrical connection between the MTJ and the metal interconnections located in the level above.

A routine search of the prior art was performed with the following references of interest being found:

U.S. Pat. No. 7,241,632 and U.S. Patent Application 2006/0234445 (both to Yang of Headway) teach CMP to expose the MTJ stacks using HSS. SiN spacers are formed on the sidewalls of the stacikes to prevent shorting after CMP. U.S. Pat. No. 7,245,522 (Aoki) teaches CMP to expose MTJ elements for electrical connection without a via hole process. No CMP details are provided. U.S. Pat. No. 6,956,270 (Fukuzumi) discloses CMP to expose MTJ stacks for connection to subsequently formed bit lines. No CMP details are provided. U.S. Patent Application 2005/0153561 (Jin et al) shows a highly selective slurry with selectivity of 100:1.

SUMMARY OF THE INVENTION

It has been an object of at least one embodiment of the present invention to provide a method for contacting a metallic area that is covered by a dielectric layer.

Another object of at least one embodiment of the present invention to provide a process for contacting the individual capping layers of GMR or TMR CPP devices that form an array on a common substrate.

Still another object of at least one embodiment of the present invention has been that said process eliminate the need for forming and then filling via holes.

A further object of at least one embodiment of the present invention has been that said process allow contact to be made to said devices without damaging any of them.

These objects have been achieved by covering said device array with a layer of dielectric material such as silicon oxide. This is followed by a three-stage CMP procedure as follows:

First, a conventional dielectric CMP slurry is used to planarize the surface of the wafer to remove some of dielectric layer from above the MTJ capping layers. Then, a slurry that is highly selective for dielectric removal relative to metal removal (HSS) is introduced to replace the conventional slurry. This serves to remove all dielectric material that was above the level of the capping layers thereby fully exposing their top surface. In the final step the slurry is first diluted by the addition of de-ionized water followed by a light buffing that both cleans the wafer surface and allows the caps to protrude above the surface to ensure full exposure of the caps which can then be contacted through a patterned metal layer formed on the final dielectric surface

BRIEF DESCRIPTION OF THE DRAWINGS

FIG. 1 illustrates the first stages of the prior art method of contacting a covered area.

FIG. 2 is a schematic cross-section of an array of GMR or TMR CPP devices after they have been covered by a layer of dielectric material.

DESCRIPTION OF THE PREFERRED EMBODIMENTS

Figure 3:
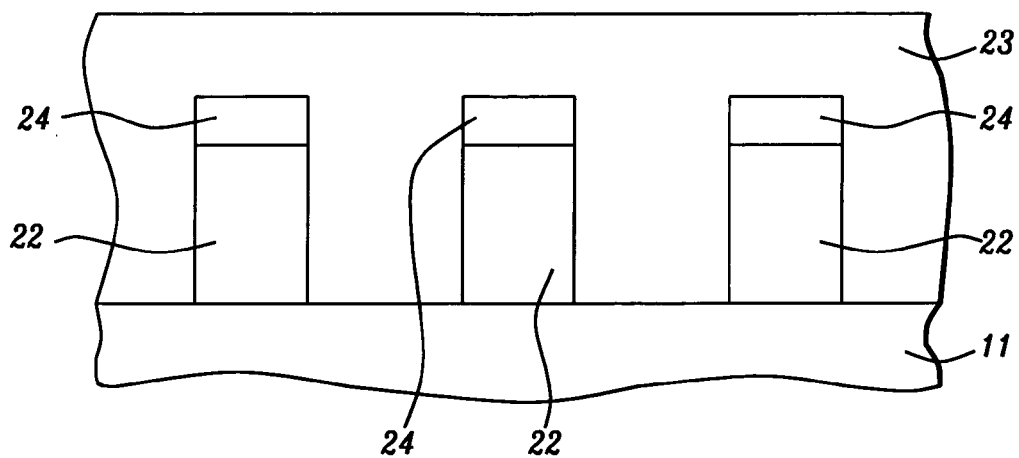
FIG. 3 shows the structure of FIG. 2 after part of the dielectric layer has been removed by conventional CMP.

Although we will describe the invention in terms of making electrical connection to a MTJ, the invention is more general than this and its teachings can be applied to many other situations where there is a need to make electrical contact to a surface that, in the completed structure, will be fully covered by a dielectric layer.

FIG. 2 illustrates, in a schematic cross-sectional view, the appearance of the structure after MTJs 22 (each having a capping layer 24) have been isolated from each other and then covered by dielectric layer 23 whose top surface 25 follows the contours of the MTJs below. In the prior art, the next step would be to planarize surface 25, etch via holes from the planarized 25 down to caps 24, over-fill these vias, followed by a second CMP step to remove excess metal.

As described below, one of the features of the invention is the use of a HSS during CMP. By doing so, the invention eliminates the photolithography sub-process of building and aligning a via hole in order to reach the MTJ structure. This reduces the cost of ownership and complexity of process integration. Also the invention ensures a clean MTJ top surface for electrical contact to this next metal interconnect layer.

CMP is used initially to directly remove the excess silicon oxide above the MTJ structure, thus creating a planarized wafer top surface, and expose the conductive metal cap layer of the MTJ structure with minimal metal removal for contact purpose, as seen in FIG. 3. With the use of a three step CMP process described below. it yields minimal recess in the silicon oxide surrounding the individual MTJ structure and around the device block, referred to as dishing and erosion respectively. Dishing and erosion are undesired from the point of process integration. Large dishing/erosion could cause shorting between MTJ and higher level interconnects. Also, excess removal of MTJ parts could lead to irreversible damage to the MTJ and render the memory element useless. The ability to fully expose the conductive cap metal layer of the MTJ structure allows it to directly contact the next metal interconnect layer and eliminates an additional process cycle of creating and aligning the via hole to the small individual MTJ structure. This elimination reduces the cost of ownership and the complexity of process integration. With the development of new spin transfer MRAM devices, the small MTJ structure (<90 nm) will make it even more difficult and costly to build the via hole layer on top of the MTJ structure.

The CMP process that is disclosed below is divided into three separate steps:

(a) A conventional dielectric CMP slurry such as Cabot Semi-Sperse® 12 (Cabot microelectronics, 870 N. Commons Dr., Aurora, Ill. 60504, USA) is used to planarize the surface of the wafer to remove some of dielectric layer 23 from above MTJ capping layer 24, as illustrated in FIG. 3.

Figure 4:
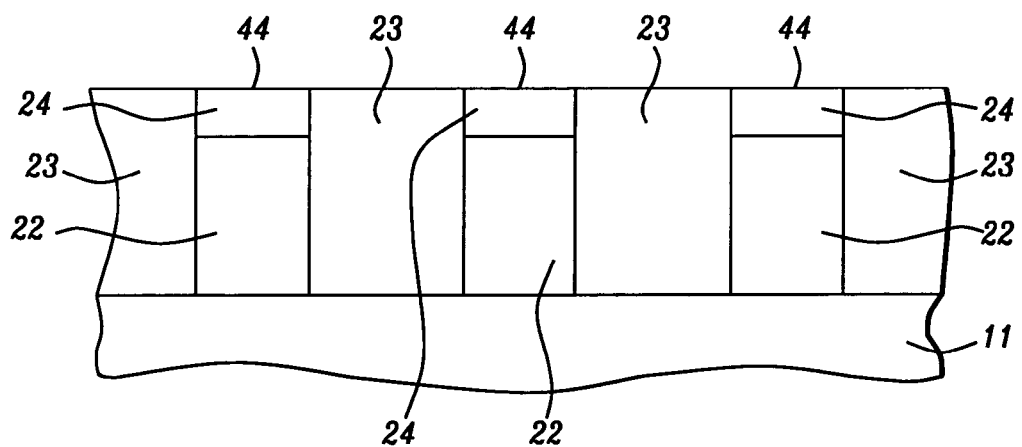
FIG. 4 shows the structure of FIG. 3 following CMP using a highly selective slurry.

(b) For the second step, a HSS, such as Asahi CES 333®, (Asahi Glass Co., Ltd., Tokyo, Japan) is introduced into the polishing system. This HSS serves to remove all dielectric material that was above the level of capping layer 24, thereby fully exposing cap 24's top surface, as illustrated in FIG. 4.

Figure 5:
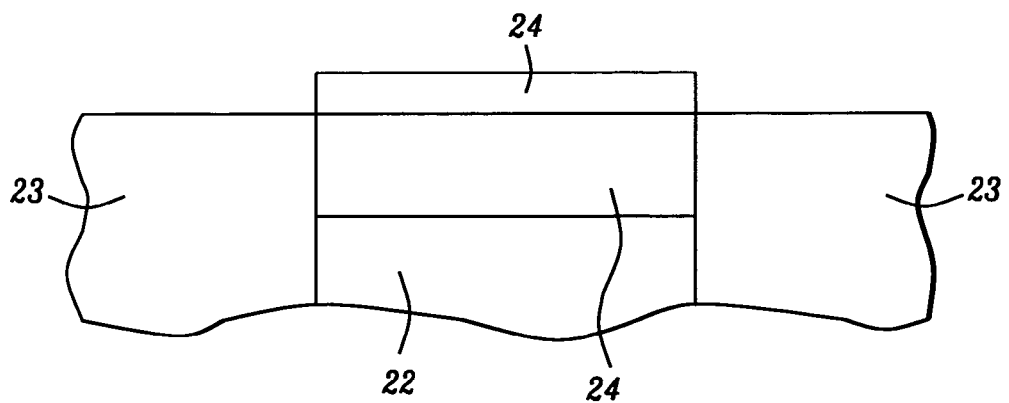
FIG. 5 shows part of the structure seen in FIG. 4 following additional CMP with the highly selective slurry diluted by deionized water.

(c) The process concludes with a light buffing third step in which the HSS of step (b) is still used but with the dilution of the slurry by the addition of de-ionized water. This both cleans the wafer surface and allows cap 24 to protrude above surface (typically by between about 0.05 and 0.2 nanometers) to ensure full exposure of the MTJ device cap, as shown in FIG. 5.

End point determination: In step (b) above, a decrease in the dielectric removal rate takes place once the wafer surface has been planarized so precise control of the amount of dielectric material that still remains above the metal cap layer after step (a) is essential. This thickness of remaining dielectric material (above the cap surface) should be in the range of from 1,000 Å to 1,500 Å. However, if the population density of the MTJ devices is decreased, due, for example, to circuit design and/or layout constraints, it becomes increasingly more important to leave the correct thickness of dielectric above the capping layers. Otherwise, excessive removal of MTJ metal material during step (b) will occur. This problem can be overcome by depositing additional dielectric material step before the CMP process.

The high selectivity slurry is designed to have a high removal rate for dielectrics relative to its removal rate of the MTJ cap metal layer, a typical selectivity ratio between silicon oxide and metal being in excess of 100:1. This will extend the window in which the CMP process has already removed all silicon oxide but not yet damaging the cap metal layer above the MTJ structure, effectively increase the margin needed to ensure the MTJ device is fully exposed.

The second HSS step can also be correctly terminated by using an optical endpoint system. Due to the difference in optical properties between the silicon oxide and the MTJ cap metal layer, variations in reflected and refracted light intensity can be detected by a light detector that is built into the CMP equipment. The afore-mentioned variations will allow the accurate detection of when the metal cap layer is fully exposed. However, to obtain an adequate signal-to-noise ratio with this endpoint detection scheme, metal should make up at least 10% of the wafer surface. For cases where the percentage of metal is less than this, more sensitive techniques, such as ellipsometry, will need to be used.

The MTJ and cap metal films are deposited on top of the previous metal interconnect layer. Then, the photolithography process is used to define the pattern layout of the devices. Reactive ion etch step is used to remove the excess MTJ films between the individual devices. A layer of silicon oxide is deposited to protect and isolate the individual MTJ devices.

The first step of the CMP process will utilize a conventional dielectric slurry to remove the bulk of the silicon oxide from the surface of the wafer. This step will also serve to planarize the topography above the MTJ devices. The silicon oxide remaining above the MTJ devices is controlled to provide enough process latitude for the second CMP step (where the HSS is to be used). The residual silicon oxide should be thin enough to avoid a prolonged polishing time where the removal rate of the silicon oxide by the HSS has been reduced to a negligible amount.

After the CMP process, the cap metal layer of the MTJ device is fully exposed for electrical contact with the next metal interconnect layer. There is minimal recession of the silicon oxide compared to the surface of the cap metal layer, minimal dishing and erosion, to prevent any possible shorting or undesirable electrical connection between the MTJ device and the above metal interconnect layer.

By keeping to a minimum the amount of cap metal that is removed, the present invention greatly reduces possible damage to the MTJ structure itself.

Since a high selective slurry has a low removal rate when the wafer is relatively planar and the pressure between the wafer and the CMP pad is relatively low, protrusion of the MTJ device block should be made to be flat or slightly convex. This will ensure the proper exposure of the cap metal layer for the MTJ device after the MTJ CMP process.

What is claimed is:

1. A method for connecting to an area that is to be fully covered by a dielectric layer, comprising:
    forming a conductive pedestal, having a top surface and a height, that contacts, and extends upwards from, said area;
    covering any exposed surfaces, including said pedestal, with a layer of dielectric material, said dielectric layer having a first top surface and a thickness that exceeds said pedestal height, whereby said pedestal is fully covered by said dielectric layer;
    using only a highly selective slurry (HSS), that removes dielectric material at a faster rate than it removes conductive material, performing chemical mechanical polishing (CMP) of said first top surface until said dielectric layer has a second top surface whereby said pedestal top surface is fully exposed without removal of any additional layers; and
    then contacting said exposed pedestal top surface, thereby connecting to said area.

2. The method of claim 1 wherein said HSS removes dielectric material at a rate that is between about 100 and 300 times faster than the rate at which it removes conductive material.

3. The method of claim 1 wherein said HSS removes dielectric material at a rate that is between about 20 and 500 times faster than the rate at which it removes conductive material.

4. The method of claim 1 wherein CMP is terminated when the intensity of light reflected from said area reaches a preset level.

5. The method of claim 1 wherein CMP is continued beyond said preset reflected light intensity value until a predetermined amount of said pedestal protrudes above said second dielectric top surface.

6. A process for connecting to a magneto-resistive, current perpendicular to plane, (MR CPP) device, comprising:
    providing a substrate and forming thereon a MR CPP device having a capping layer;
    fully covering said MR CPP device with a layer of dielectric material, said dielectric layer having a first top surface that is at least 500 Angstroms above said capping layer;
    using conventional CMP, including a conventional slurry, etching said dielectric layer until it has a second top surface that is at most 50 Angstroms above said capping layer;
    then replacing said conventional slurry with a highly selective slurry (HSS), that preferentially removes dielectric material relative to metal, and then continuing to use CMP whereby all dielectric material above said capping layer is removed, thereby fully exposing a top surface of said capping layer;
    diluting said HSS with deionized water and then lightly buffing all top surfaces whereby said top surfaces are cleaned and said capping layer protrudes above said cleaned surface; and
    then forming, on said cleaned surface, a connection to said protruding capping layer, thereby facilitating contacting said MR CPP devices with minimal risk of damaging said MR CPP devices.

7. The process recited in claim 6 wherein said dielectric material is selected from the group consisting of silicon oxide and silicon nitride.

8. The process recited in claim 6 wherein said capping layer is selected from the group consisting of nickel, iron, tantalum, ruthenium, platinum, and all rare earth metals.

9. The process recited in claim 6 wherein said dielectric material is silicon oxide and said capping layer is tantalum.

10. The process recited in claim 6 wherein said HSS removes dielectric material at rate that is between about 100 and 300 times faster than the rate at which it removes conductive material.

11. The process recited in claim 6 wherein said HSS removes dielectric material at a rate that is between about 50 and 500 times faster than the rate at which it removes conductive material.

12. The process recited in claim 6 wherein a determination of when conventional CMP, using said conventional slurry, is to be terminated is based on measurements of light reflected from said dielectric second top surface.

13. The process recited in claim 6 wherein a determination of when CMP, using said HSS, is to be terminated is based on measurements of light reflected from said dielectric surface after all dielectric material above said capping layer has been removed and said top surface of said capping layer has been fully exposed.

14. The process recited in claim 6 wherein the step of etching said dielectric layer until it has a second top surface that is at most 50 Angstroms above said capping layer enables a top metal layer to be in close proximity to said MR CPP device thereby increasing magnetic field detection efficiency of said MR CPP device.

* * * * *